(12) United States Patent
Kim et al.

(10) Patent No.: US 8,969,204 B2
(45) Date of Patent: Mar. 3, 2015

(54) CMP SLURRY AND A POLISHING METHOD USING THE SAME

(75) Inventors: Jong-Pil Kim, Daejeon (KR); Seung-Beom Cho, Daejeon (KR); Jun-Seok Noh, Daejeon (KR); Jang-Yul Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 349 days.

(21) Appl. No.: 12/921,341

(22) PCT Filed: Mar. 3, 2009

(86) PCT No.: PCT/KR2009/001036
§ 371 (c)(1),
(2), (4) Date: Sep. 7, 2010

(87) PCT Pub. No.: WO2009/110729
PCT Pub. Date: Sep. 11, 2009

(65) Prior Publication Data
US 2011/0008967 A1    Jan. 13, 2011

(30) Foreign Application Priority Data

Mar. 6, 2008  (KR) .................. 10-2008-0021053
Feb. 20, 2009 (KR) .................. 10-2009-0014432

(51) Int. Cl.
| | | |
|---|---|---|
| H01L 21/302 | (2006.01) | |
| H01L 21/461 | (2006.01) | |
| C03C 15/00 | (2006.01) | |
| C03C 25/68 | (2006.01) | |
| H01L 21/3105 | (2006.01) | |
| C09G 1/02 | (2006.01) | |
| C09K 3/14 | (2006.01) | |
| H01L 21/762 | (2006.01) | |

(52) U.S. Cl.
CPC ............ *H01L 21/31053* (2013.01); *C09G 1/02* (2013.01); *C09K 3/1463* (2013.01); *H01L 21/76229* (2013.01)
USPC ........... 438/691; 438/689; 438/690; 438/692; 438/693; 216/83; 216/88; 216/89

(58) Field of Classification Search
None
See application file for complete search history.

(56) References Cited

U.S. PATENT DOCUMENTS

| | | | |
|---|---|---|---|
| 6,048,771 A | 4/2000 | Lin et al. | |
| 7,118,686 B2 * | 10/2006 | Sinha et al. | .................. 252/79.1 |
| 2005/0108947 A1 | 5/2005 | Mueller et al. | |
| 2005/0189322 A1 * | 9/2005 | Lane et al. | ....................... 216/88 |
| 2005/0252092 A1 | 11/2005 | Kim et al. | |
| 2007/0099427 A1 | 5/2007 | Oh et al. | |

FOREIGN PATENT DOCUMENTS

| | | |
|---|---|---|
| CN | 1660923 A | 8/2005 |
| JP | 2004-79984 A | 3/2004 |

(Continued)

*Primary Examiner* — Nadine Norton
*Assistant Examiner* — Stephanie Duclair
(74) *Attorney, Agent, or Firm* — Rothwell, Figg, Ernst & Manbeck, P.C.

(57) ABSTRACT

The present invention relates to a CMP slurry that is able to reduce dishing generation, when it is applied to polishing or planarization of silicon oxide layer, for example, and a polishing method.
The CMP slurry includes a polishing abrasive, a linear anionic polymer, a compound including a phosphoric acid group, and water, and the ratio of CMP polishing speed to a silicon oxide layer: CMP polishing speed to a silicon nitride layer is 30:1 to 50:1.

10 Claims, 1 Drawing Sheet

(56) References Cited

FOREIGN PATENT DOCUMENTS

| | | |
|---|---|---|
| JP | 2005-179421 A | 7/2005 |
| JP | 2007-019428 A | 1/2007 |
| KR | 10-2001-0006264 A | 1/2001 |
| KR | 10-2005-0004051 A | 1/2005 |
| KR | 10-2006-0123878 A | 12/2006 |
| TW | I268954 | 12/2006 |
| TW | 200720413 A | 6/2007 |
| TW | 200800486 A | 1/2008 |
| WO | 2005/014746 A1 | 2/2005 |
| WO | 2007/086665 A1 | 8/2007 |

* cited by examiner

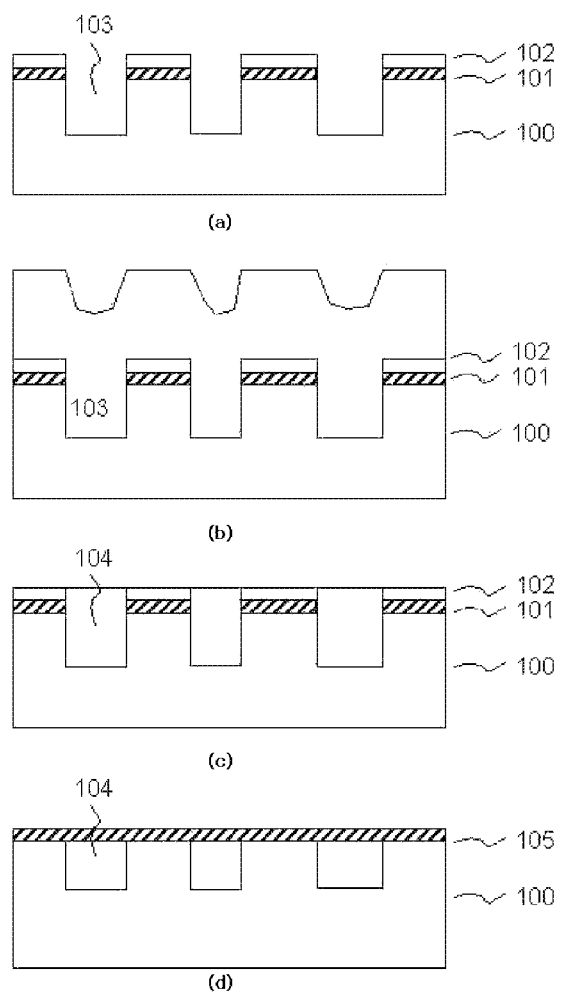

CMP SLURRY AND A POLISHING METHOD USING THE SAME

CROSS REFERENCE TO RELATED APPLICATIONS

This application is a 35 U.S.C. §371 National Phase Entry Application from PCT/KR2009/001036, filed Mar. 3, 2009, and designating the United States, which claims priority under 35 U.S.C. §119 to Korean Patent Application No. 10-2008-0021053 filed Mar. 6, 2008 and Korean Patent Application No. 10-2009-0014432 filed Feb. 20, 2009, which are incorporated herein in their entireties.

BACKGROUND OF THE INVENTION (a) Field of the Invention

The present invention relates to a slurry for chemical mechanical polishing (CMP) (hereinafter, "CMP slurry") and a polishing method using the same. The present invention particularly relates to the CMP slurry that is able to reduce dishing generation when it is applied to a polishing or planarization of silicon oxide layer, for example, and the polishing method.

(b) Description of the Related Art

Up to now, as a device isolation technique, LOCOS (Local Oxidation of Silicon) process that grows a silicon oxide layer selectively on a semiconductor substrate and forms a device isolation layer has been used. However, the LOCOS process revealed its limit of decreasing the width of the device isolation layer as the semiconductor device is highly integrated and micronized, and STI (Shallow Trench Isolation) process that defines a field region separating active regions by forming a trench on the semiconductor substrate and filling inside of the trench with an insulation layer such as a silicon oxide layer was introduced.

FIG. 1 shows a schematic diagram of a general STI process.

Referring to FIG. 1, (a) a pad oxide layer 101 and a silicon nitride layer 102 are successively formed on a semiconductor substrate 100 at first. At this time, the silicon nitride layer 102 may act as a polishing stop layer in later polishing process. Subsequently, the silicon nitride layer 102 and the pad oxide layer 101 are patterned by applying a photolithography process using a photoresist so that the field region is defined, and a trench 103 having a certain depth is formed by etching the semiconductor substrate 100 by using the pattern as a mask.

(b) A silicon oxide layer 104 is deposited so that the trench 103 is filled, and (c) the silicon oxide layer 104 is polished and planarized until the silicon nitride layer 102 is exposed. Subsequently, a device isolation layer can be formed and the field region can be defined by eliminating the pad oxide layer 101 and the silicon nitride layer 102, and then a gate insulation layer 105 is formed.

It is needed in the polishing step (c) of the STI process to carry out the CMP process with high polishing selectivity showing superior polishing rate to the silicon oxide layer and low polishing rate to the silicon nitride layer, for effective and selective polishing and planarization of the silicon oxide layer 104.

However, a dishing is generated when the polishing selectivity becomes excessively high in the CMP process and it may cause the property deterioration of the device, because the silicon oxide layer filled in the trench is excessively polished. Particularly, the dishing problem causes a stepped defect between the active region and the field region in an ultra-micronized device of which line width of the trench is 50 nm or less, and it may have a bad effect on performance and reliability of the device.

SUMMARY OF THE INVENTION

It is an aspect of the present invention to provide a CMP slurry that is able to reduce the dishing when it is applied to polishing of a silicon oxide layer and the like.

It is another aspect of the present invention to provide a polishing method using the CMP slurry.

The present invention provides a CMP slurry including a polishing abrasive, a linear anionic polymer, a compound including a phosphoric acid group, and water, wherein the ratio of CMP polishing speed to a silicon oxide layer: CMP polishing speed to a silicon nitride layer is 30:1 to 50:1.

The present invention also provides a polishing method including the step of polishing a target layer on a semiconductor substrate with the CMP slurry.

BRIEF DESCRIPTION OF THE DRAWINGS

FIG. 1 is a schematic diagram of a general shallow trench isolation (STI) process. In FIG. 1, 100 represents a semiconductor substrate, 101 represents a pad oxide layer, 102 represents a silicon nitride layer, 103 represents a trench, 104 represents a silicon oxide layer, and 105 represents a gate insulation layer.

DETAILED DESCRIPTION OF THE EMBODIMENTS

Hereinafter, the CMP slurry according to the embodiment of the invention, and the polishing method are explained in more detail.

According to one embodiment of the invention, a CMP slurry including a polishing abrasive, a linear anionic polymer, a compound including a phosphoric acid group, and water, wherein the ratio of CMP polishing speed to a silicon oxide layer: CMP polishing speed to a silicon nitride layer is 30:1 to 50:1 is provided.

The CMP slurry includes the linear anionic polymer and the compound including the phosphoric acid group in addition to water and the polishing abrasive those are commonly included in the slurry, and the ratio of CMP polishing speed to a silicon oxide layer: CMP polishing speed to a silicon nitride layer is 30:1 to 50:1.

The CMP slurry can reduce dishing generation of the silicon oxide layer and the like, when it is applied to the silicon oxide layer for example, while enabling selective and effective polishing of the silicon oxide layer, according to the following mechanisms.

The silicon nitride constituting the silicon nitride layer basically has a positive charge on its surface and the silicon oxide constituting the silicon oxide layer has a negative charge on its surface. Therefore, when the linear anionic polymer is included in the CMP slurry, the linear anionic polymer adheres to the silicon nitride layer by an electrostatic force during the polishing process using the CMP slurry, and the polishing to the silicon nitride layer may be inhibited relatively. Therefore, the CMP slurry including the linear anionic polymer can show superior polishing selectivity so that the ratio of CMP polishing speed to the silicon oxide layer: CMP polishing speed to the silicon nitride layer may be 30:1 or more, for example. Accordingly, the CMP slurry may preferably be applied to a polishing or planarizing process of the silicon oxide layer using the silicon nitride layer as the polishing stop layer, for example, a STI (Shallow Trench Isolation) process or a process of forming an ILD (Inter Layer Dielectric) of semiconductor device, and it enables selective and effective polishing of the silicon oxide layer.

However, it is revealed from the experimental results by the present inventors that the silicon oxide layer is excessively polished and the dishing generation is increased in the polishing process of the silicon oxide layer using the silicon nitride as the polishing stop layer, when the CMP slurry has excessively high polishing selectivity of more than 50:1, It is due to that the silicon nitride layer is hardly polished and only the silicon oxide layer is polished by the CMP slurry from the point of time when the silicon nitride layer is exposed.

Therefore, the CMP slurry according to one embodiment of the invention includes the compound including the phosphoric acid group, and the ratio of CMP polishing speed to the silicon oxide layer: CMP polishing speed to the silicon nitride layer is 50:1 or less.

The compound including the phosphoric acid group shows some degree of etching rate (polishing rate) to both of the silicon oxide layer and the silicon nitride layer. Therefore, if the CMP slurry includes the compound including the phosphoric acid group, not only the silicon oxide layer but also the silicon nitride layer that is used as the polishing stop layer may be somewhat polished or removed. Therefore, it is possible to prevent the polishing speed to the silicon oxide layer from becoming excessively higher than that to the silicon nitride layer, and the silicon oxide layer from being excessively polished. Therefore, the dishing generation on the silicon oxide layer can largely be decreased by using the CMP slurry comprising the compound including the phosphoric acid group.

Particularly, as supported by Examples disclosed below, it is revealed that the dishing generation on the silicon oxide layer can be decreased more and more while effective polishing or planarization is possible by using the CMP slurry according to one embodiment, that comprises the compound including the phosphoric acid group and of which CMP polishing speed to the silicon oxide layer: CMP polishing speed to the silicon nitride layer is 50:1 or less. It is because superior polishing selectivity to the silicon oxide layer is maintained and over-polishing of the silicon oxide layer is prevented.

Furthermore, the processing time may also be decreased because the CMP slurry comprising the compound including the phosphoric acid group can show more increased polishing speed to the silicon oxide layer and the silicon nitride layer.

Therefore, it is possible to reduce the dishing generation on the silicon oxide layer largely while enabling selective and effective polishing or planarization of the silicon oxide layer, when the CMP slurry according to one embodiment of the invention is used to the polishing process of the silicon oxide layer, for example, to the STI process or the ILD process that polishes the silicon oxide layer while using the silicon nitride layer as the polishing stop layer.

Furthermore, each constituent of the CMP slurry according to one embodiment of the invention is explained as follows.

First, the CMP slurry includes a polishing abrasive as the basic constituent. Common polishing abrasives those have been included in the CMP slurry may be unlimitedly used, and at least one kind of polishing abrasives of silica, alumina, zirconium oxide, titanium oxide, or cerium oxide, and the like may be used for example. The polishing abrasives may have a diameter of nanometer scale, and may preferably be cerium oxide abrasives having a diameter of nanometer scale.

The polishing abrasive may be included with 0.1 to 10 parts by weight per 100 parts by weight of the CMP slurry. The polishing speed, for example, to the silicon oxide layer may be insufficient when the content of the polishing abrasive becomes excessively low, on the contrary, the stability of the slurry may be decreased when the content becomes excessively high.

The CMP slurry also comprises the compound including the phosphoric acid group and the linear anionic polymer in addition to the polishing abrasive.

Among them, the compound including the phosphoric acid group takes roles of increasing the polishing speed totally to the target layer, for example, to the silicon oxide layer and the silicon nitride layer, and decreasing the dishing generation on the silicon oxide layer and the like because it prevents the ratio of polishing speed to the silicon oxide layer and to the silicon nitride layer from getting excessively large or the silicon oxide layer from being excessively polished.

The compound including the phosphoric acid group may be any compound including the phosphoric acid group ($-PO_4$), for example, phosphoric acid, an organic phosphate, or an inorganic phosphate, and may be any monomer or polymer including the phosphoric acid group. For example, the compound including the phosphoric acid group may be ammonium phosphate ($(NH_4)_2HPO_4$), considering the etching rate (polishing rate) to the silicon oxide layer and the silicon nitride layer.

The compound including the phosphoric acid group may be included with 0.1 to 20 parts by weight, and preferably with 1 to 10 parts by weight, per 100 parts by weight of the polishing abrasive. It is difficult to reduce the dishing generation sufficiently when the content of the compound including the phosphoric acid group becomes excessively low, on the contrary, there is no more additional decreasing effect of the dishing generation and the dispersion stability of the slurry is also decreased and the coagulation may occur when the content becomes excessively high.

Furthermore, the linear anionic polymer takes a role of protecting the silicon nitride layer relatively from polishing because it adheres to the silicon nitride layer by an electrostatic force and acts as a protecting layer during the polishing process using the CMP slurry. The CMP slurry can show superior polishing selectivity to the silicon oxide layer comparing to the silicon nitride layer by this operation of the linear anionic polymer. Particularly, the dishing generation caused by excessive polishing of the silicon oxide layer can largely be reduced while enabling effective and selective polishing or planarization of the silicon oxide layer, due to interaction of the compound including the phosphoric acid group and the linear anionic polymer.

As the linear anionic polymer, for example, a polymer including a carboxylic acid may be used. More particularly, a polymer obtained by polymerizing at least one monomer selected from acrylic acid, methacrylic acid, itaconic acid, and maleic acid may be used. As the linear polymer, a polymer that is already known to the related industry or a polymer on the market may be used as the linear polymer, and Cerasperse 5468 of San Nopco Korea LTD. Co., a linear polymer of Aldrich Co., and the like may be used as the polymer on the market.

It is preferable that the weight average molecular weight of the linear anionic polymer is 2,000 to 50,000, The polishing selectivity may get lower because the polishing speed (polishing rate) to the silicon nitride layer becomes higher when the weight average molecular weight becomes excessively low, on the contrary, the coagulation of the polishing abrasives may be caused when the weight average molecular weight becomes excessively high.

The linear anionic polymer may be included with 0.1 to 40 parts by weight, preferably 0.1 to 20 parts by weight, per 100 parts by weight of the polishing abrasive. The polishing selectivity may get lower because the polishing speed (polishing rate) of the slurry to the silicon nitride layer becomes higher when the content of the linear anionic polymer becomes excessively low, on the contrary, the processing time may be increased or the polishing selectivity may be deteriorated because the polishing speed to the silicon oxide layer is decreased and the dispersion stability of the slurry may be deteriorated because the polishing abrasives are coagulated when the content becomes excessively high.

Furthermore, the CMP slurry according to one embodiment of the invention may further include a compound including any one of a hydroxyl group (—OH) or a carboxyl group (—COOH), or both of them in addition to the constituents disclosed above, and preferably further include a compound including both of the hydroxyl group (—OH) and the carboxyl group (—COOH).

When the compound is included in the CMP slurry, the slurry can contact more uniformly with the polishing pad of a CMP polishing device or a semiconductor substrate on which the target layer is formed, according to Newtonian behavior, because the viscosity of the slurry becomes low. As a result, the target layer may be polished more uniformly and WIWNU (Within-Wafer Non-Uniformity) of the target layer may be decreased.

It is preferable that the weight average molecular weight of the compound including the hydroxyl group (—OH) and/or the carboxyl group (—COOH) is 30 to 500. When the weight average molecular weight becomes excessively high, the polishing speed to the silicon oxide layer may be decreased, or it becomes difficult to provide the slurry because the dispersion stability of the slurry is deteriorated.

As the compound including the hydroxyl group (—OH) and/or the carboxyl group (—COOH), a compound or two or more compounds selected from a compound including a citrate group, a compound including a gluconate group, a compound including a malate group, a compound including a tartarate group, a compound including a 2-hydroxyisobutyrate group, a compound including an adipate group, a compound including an octanoate group, a compound including a succinate group, a compound including an ethylenediaminetetraacetic acid (EDTA) group, a compound including a glutarate group, and a compound including a methylenesuccinate group may be used.

At this time, said "compound including a specific functional group (a citrate group, a gluconate group, and so on)" includes not only an acid itself including each specific functional group, for example, citric acid, gluconic acid, malic acid, tartaric acid, 2-hydroxyisobutyric acid, adipic acid, octanoic acid, succinic acid, ethylenediaminetetraacetic acid (EDTA), glutaric acid, or methylenesuccinic acid, but also a compound in which an inorganic (for example, a metal) functional group or an organic functional group is combined with the specific functional group.

In addition to the compounds, mannose, glycero-galacto-heptose, erythro-manno-octose, arabino-galacto-nonose, glutamine, and the like, or derivatives thereof may be also used as the compound including the hydroxyl group (—OH) and/or the carboxyl group (—COOH), and many other organic or inorganic compounds may be used.

It is preferable that the compound including the hydroxyl group (—OH) and/or the carboxyl group (—COOH) is included with 0.1 to 30 parts by weight per 100 parts by weight of the polishing abrasive. The polishing selectivity of the slurry may be decreased and the WIWNU (Within-Wafer Non-Uniformity) may be increased when the content of the compound becomes excessively low, on the contrary, the polishing speed of the slurry to the silicon oxide layer may be decreased when the content becomes excessively high.

Furthermore, the CMP slurry composition includes water as the medium of the constituents disclosed above. The water may be included with the rest content except the total content of the constituents disclosed above, for example, with the content of 94 to 99.8 parts by weight per 100 parts by weight of the slurry. The stability of the slurry is decreased when the content of the water becomes excessively low, and overall polishing rate of the slurry may be decreased when the content becomes excessively high.

The CMP slurry also may further include various additives in addition to the constituents disclosed above for improving polishing performance or dispersion stability of the slurry. Any additive that has been used to the CMP slurry before this may be used as the additive and the kind of the additive is not particularly limited.

The CMP slurry can be prepared by mixing the polishing abrasive, the linear anionic polymer, the compound including the phosphoric acid group, and selectively the compound including the hydroxyl group (—OH) or the carboxyl group (—COOH) with water. Considering superior polishing rate and polishing selectivity to the silicon oxide layer, it is preferable to titrate the slurry to be pH 6 to 8 after mixing. In the titration process, 1N $NH_4OH$, 1N $HNO_3$, and the like may be used.

Furthermore, the CMP slurry may be any one type of one-component slurry or two-component slurry. At this time, the one-component slurry is a type of that all constituents necessary for polishing, for example, the polishing abrasive, water, the linear anionic polymer, and the like, and optional additives are included in one composition, and the two-component slurry is a type of that the slurry is divided into two different solutions, for example, a dispersion solution of the polishing abrasive and a dispersion solution of the additives so as to form each component separately, and the dispersion solutions are mixed just before polishing. The latter may be used when the dispersibility of the polishing abrasive would be decreased by the additives.

The CMP slurry disclosed above can show high polishing speed to the silicon oxide layer, for example, of 2000 Å/min or more, and preferably of 2500 Å/min or more, and it can also show superior polishing selectivity of that CMP polishing speed to the silicon oxide layer: CMP polishing speed to the silicon nitride layer is 30:1 or more, because the slurry shows low polishing speed to the silicon nitride layer.

Therefore, the CMP slurry enables the silicon oxide layer to be selectively and effectively polished, in the polishing or planarizing process of the silicon oxide layer using the silicon nitride layer as the polishing stop layer.

Furthermore, the CMP slurry can reduce the dishing generation caused by excessive polishing of the silicon oxide layer, because the ratio of CMP polishing speed to the silicon oxide layer: CMP polishing speed to the silicon nitride layer is 50:1 or less.

Therefore, the CMP slurry can be very preferably applied to the process of polishing or planarizing the silicon oxide layer using the silicon nitride layer as the polishing stop layer, for example, to the planarization process of the silicon oxide layer that is filled in the trench in the STI process of the semiconductor device, or to the ILD forming process, and it is possible to reduce the dishing generation and prevent the performance deterioration of the device due to the same.

According to another embodiment of the invention, a polishing method including the step of polishing the target layer on the semiconductor substrate with the CMP slurry disclosed above is provided. In the polishing method, the target layer may be the silicon oxide layer.

More particularly, the polishing method may be a method of polishing or planarizing the silicon oxide layer while using the silicon nitride layer as the polishing stop layer, and, for example, may include the steps of forming a certain pattern of the silicon nitride layer on the semiconductor substrate; forming the silicon oxide layer on the semiconductor substrate on which the silicon nitride layer pattern is formed; and polishing the silicon oxide layer until the silicon nitride layer pattern is exposed.

By carrying out the polishing method with the CMP slurry, dishing generation after polishing the silicon oxide layer may largely be reduced, and particularly it is possible to contribute to improving performance or reliability of the semiconductor device by reducing the amount of dishing generation to be 500 Å or less.

At this time, the amount of dishing generation may be defined as the stepped defect of the polished silicon oxide layer and the silicon nitride layer after carrying out the polishing method, and it can be calculated by measuring profile of the silicon oxide layer and the silicon nitride layer through AFM analysis to a monitoring box.

The polishing method disclosed above may be applied to the shallow trench isolation (STI) process of the semiconductor device (at this time, the silicon oxide layer that is the target layer to be polished may define the field region of the semiconductor device by forming a device isolation layer that is filled in the trench), and may also be applied to many other processes such as a process of forming an inter layer dielectric (ILD) of a semiconductor device. Concrete method of the STI process or the ILD forming process may follow a general method, for example, as illustrated in FIG. 1.

EXAMPLES

Hereinafter, the constitution and the function of the present invention are presented in more detail through preferable examples of the invention. However, the following examples are only for illustrating the present invention and the scope of the present invention is not limited to or by them.

Example 1

The CMP slurry was prepared by adding cerium oxide as the polishing abrasive, a polyacrylic acid (Mw.: 7,000) as the linear anionic polymer, gluconic acid as the compound including the hydroxyl group and/or the carboxyl group, and ammonium phosphate $((NH_4)_2HPO_4)$ as the compound including the phosphoric acid group into pure water and mixing the same.

At this time, the amount of the polishing abrasive added was 5 parts by weight per 100 parts by weight of the CMP slurry, the amount of the linear anionic polymer added was 10 parts by weight per 100 parts by weight of the cerium oxide polishing abrasive, the amount of the compound including the hydroxyl group and/or the carboxyl group added was 25 parts by weight per 100 parts by weight of the cerium oxide polishing abrasive, and the amount of the compound including the phosphoric acid group added was 1.5 parts by weight per 100 parts by weight of the cerium oxide polishing abrasive.

Examples 2-4

The CMP slurries were prepared substantially according to the same method as in Example 1, except that the contents of the compound including the hydroxyl group and/or the carboxyl group, and the compound including the phosphoric acid group was changed as disclosed in the following Table 1.

Comparative Example 1

The CMP slurry was prepared substantially according to the same method as in Example 1, except that the compound including the phosphoric acid group was not used.

Experimental Example 1

Evaluation for Polishing Performance

After polishing a substrate by using the CMP slurries prepared in Examples 1-4 and Comparative Example 1 in the following conditions and washing the substrate cleanly, the change in the thickness generated by the polishing was measured and the polishing performance was evaluated. The results are listed in the following Table 1.

[Polishing Condition]

Polishing device: UNIPLA210 (Doosan Mecatec Co.)

Pad: IC1000 (Rodel Co.)

Spindle speed: 90 rpm

Platen speed: 90 rpm

Wafer pressure: 4 psi

Retainer ring pressure: 3.5 psi

Flow rate of the slurry: 200 ml/min

[Target for Polishing]

A wafer on which a silicon oxide layer of 10,000 Å was deposited by HDP CVD (High Density Plasma chemical vapor deposition)

A wafer on which a silicon nitride layer of 2,000 Å was deposited by LPCVD (Low pressure chemical vapor deposition)

[Evaluation]

59 points were set on each wafer to be polished at first and the thicknesses at each point before and after polishing were measured. At this time, the thicknesses before and after polishing were measured by using Nanospec 6100 (Nanometrics Co.) that is an optical device for measuring thickness. From the thicknesses before and after polishing, the polished amount of each target layer (the silicon oxide layer or the silicon nitride layer) was measured and the average value was calculated on basis of the values measured at the points. The polishing speed to each target layer was deduced from the average value of the polished amount and the polishing time.

Furthermore, the polishing selectivity was deduced on basis of the ratio of polishing speed to the silicon oxide layer/polishing speed to the silicon nitride layer.

The average value of the thickness difference of the points was calculated on basis of the thicknesses measured at each point on the wafer on which the silicon oxide layer was formed. The average values were calculated before and after polishing, and delta WIWNU was deduced from the difference of them.

Furthermore, when the polished amount (the thickness before polishing—the thickness after polishing) was calculated at 59 points on the wafer on which the silicon oxide layer was formed, the GAP data was deduced as the maximum value of the polished amount—the minimum value of the polished amount among 59 values measured at the points.

TABLE 1

| | Constituents (Parts by weight; per 100 parts by weight of the polishing abrasive) | | | Polishing speed (Å/nm) | | Polishing selectivity | Delta WIWNU (%) | GAP |
|---|---|---|---|---|---|---|---|---|
| | Polyacrylic acid | Gluconic acid | Ammonium phosphate | Silicon oxide layer | Silicon nitride layer | | | |
| Comparative Example 1 | 10 | 12 | — | 3248 | 59 | 55 | 3.24 | 437 |
| Example 1 | 10 | 12 | 1.5 | 3504 | 73 | 48 | 2.92 | 302 |
| Example 2 | 10 | 25 | 7 | 2509 | 63 | 40 | 2.63 | 218 |
| Example 3 | 10 | 25 | 9 | 2632 | 68 | 39 | 2.46 | 228 |
| Example 4 | 10 | 25 | 11 | 2961 | 86 | 34 | 2.06 | 259 |

Experimental Example 2

Measurement of Dishing Generation

A wafer on which a common DRAM pattern (including the silicon oxide layer and the silicon nitride layer in the pattern of the STI device isolation layer) was formed was polished for 1 minute by using the CMP slurry prepared in Examples 1 and 2, and Comparative Example 1 in the same polishing condition as in Experimental Example 1.

[Evaluation]

The profile of the silicon oxide layer and the silicon nitride layer was measured by AFM analysis to 100 μm FOX Monitoring box in the wafer after polishing, and the stepped defect of the silicon oxide layer and the silicon nitride layer of the wafer was calculated and the average value was determined as the amount of dishing generation.

TABLE 2

| | Dishing generation (Å) |
|---|---|
| Example 1 | 400 |
| Example 2 | 250 |
| Comparative Example 1 | 930 |

Referring Table 1, it is recognized that the CMP slurries of Examples 1 to 4 including the linear anionic polymer (polyacrylic acid) and the compound including the phosphoric acid (ammonium phosphate) show high polishing selectivity of 30:1 or more, however, the polishing selectivity is not over 50:1.

Furthermore, it is recognized by referring Table 2 that the dishing on the silicon oxide layer can more largely be reduced when the CMP slurries of Example 1 and 2 which satisfy the constituents and the polishing selectivity of 30:1 to 50:1 are used in the polishing than the case of using the CMP slurry of Comparative Example 1.

In addition to, it is recognized by referring Table 1 that the selective and effective polishing to the silicon oxide layer is possible because the cases using the CMP slurries of Examples 1 to 4 show superior polishing speed and polishing selectivity to the silicon oxide layer.

Furthermore, it is recognized that the polishing is uniformly proceeded when proceeding the polishing with the CMP slurries of Examples 1 to 4 in comparison with when using the CMP slurry of Comparative Example 1.

What is claimed is:

1. A chemical mechanical polishing (CMP) slurry, comprising a polishing abrasive, a linear anionic polymer having a weight average molecular weight of 2,000 to 50,000 and including a carboxylic acid, ammonium phosphate ($(NH_4)_2HPO_4$), a compound having a weight average molecular weight of 30 to 500 and including a hydroxyl group or a carboxyl group, and water, wherein the ratio of CMP polishing speed to a silicon oxide layer : CMP polishing speed to a silicon nitride layer is 30:1 to 50:1, wherein the polishing abrasive is included with 0.1 to 10 parts by weight per 100 parts by weight of the slurry, the linear anionic polymer is included with 0.1 to 40 parts by weight per 100 parts by weight of the polishing abrasive, and the ammonium phosphate ($(NH_4)_2HPO_4$) is included with 0.1 to 20 parts by weight per 100 parts by weight of the polishing abrasive, the linear anionic polymer having a weight average molecular weight of 2,000 to 50,000 includes a polymer obtained from at least one monomer selected from the group consisting of acrylic acid, methacrylic acid, itaconic acid, and maleic acid, and wherein the compound having a weight average molecular weight of 30 to 500 and including the hydroxyl group or the carboxyl group includes at least one compound selected from the group consisting of a compound including a citrate group, a compound including a gluconate group, a compound including a malate group, a compound including a tartrate group, a compound including a 2-hydroxyisobutyrate group, a compound including an adipate group, a compound including an octanoate group, a compound including a succinate group, a compound including an ethylenediaminetetraacetic acid (EDTA) group, a compound including a glutarate group, a compound including a methylenesuccinate group, mannose, glycero-galacto-heptose, erythro-manno-octose, arabino-galacto-nonose, and glutamine.

2. The CMP slurry according to claim 1, wherein the polishing abrasive includes at least one kind of materials selected from the group consisting of silica, alumina, zirconium oxide, titanium oxide, and cerium oxide.

3. The CMP slurry according to claim 1, wherein the compound having a weight average molecular weight of 30 to 500 including a hydroxyl group (—OH) or a carboxyl group (—COOH) is included with 0.1 to 30 parts by weight per 100 parts by weight of the polishing abrasive.

4. The CMP slurry according to claim 1, having pH 6 to 8.

5. The CMP slurry according to claim 1, which is used for polishing or planarization of a silicon oxide layer filled in a trench in a shallow trench isolation (STI) process of a semiconductor device.

6. A polishing method, comprising the step of polishing a target layer on a semiconductor substrate with the CMP slurry according to claim 1.

7. The polishing method according to claim 6, wherein the target layer includes a silicon oxide layer.

8. The polishing method according to claim 7, comprising the steps of;
- forming a certain pattern of a silicon nitride layer on the semiconductor substrate;
- forming the silicon oxide layer on the semiconductor substrate on which the silicon nitride layer pattern is formed; and
- polishing the silicon oxide layer until the silicon nitride layer pattern is exposed.

9. The polishing method according to claim 8, wherein the method is applied to a shallow trench isolation (STI) process of a semiconductor device, and the silicon oxide layer that is to be polished defines a field region of the semiconductor device.

10. The polishing method according to claim 8, wherein the amount of dishing generation is 500 Å or less after polishing the silicon oxide layer.

* * * * *